US012658925B2

(12) United States Patent
Huott et al.

(10) Patent No.: US 12,658,925 B2
(45) Date of Patent: Jun. 16, 2026

(54) IMPLEMENTING A LOW POWER TOPOLOGY IN A CLOCKED LATCH

(71) Applicant: INTERNATIONAL BUSINESS MACHINES CORPORATION, Armonk, NY (US)

(72) Inventors: William V. Huott, Holmes, NY (US); Ann Chen Wu, Hopewell Junction, NY (US); Leon Sigal, Monsey, NY (US); Hans Mikael Jacobson, White Plains, NY (US); Paul Alan Bunce, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 18/802,876

(22) Filed: Aug. 13, 2024

(65) Prior Publication Data

US 2026/0051892 A1     Feb. 19, 2026

(51) Int. Cl.
    *H03L 7/081*     (2006.01)
    *H04L 7/033*     (2006.01)

(52) U.S. Cl.
    CPC .............. *H03L 7/081* (2013.01); *H04L 7/033* (2013.01)

(58) Field of Classification Search
    None
    See application file for complete search history.

(56) References Cited

U.S. PATENT DOCUMENTS

| | | | |
|---|---|---|---|
| 4,339,793 | A | 7/1982 | Marenin |
| 5,498,988 | A | 3/1996 | Reyes et al. |
| 6,075,386 | A | 6/2000 | Naffziger |
| 6,803,783 | B2 | 10/2004 | Zhu et al. |
| 7,051,294 | B2 | 5/2006 | Masleid |
| 7,772,906 | B2 | 8/2010 | Naffziger |
| 7,868,677 | B2 | 1/2011 | Jain |
| 8,471,618 | B2 | 6/2013 | Chien et al. |
| 8,836,379 | B2 | 9/2014 | Guntur et al. |
| 8,908,449 | B1 | 12/2014 | Ramaraju |

(Continued)

FOREIGN PATENT DOCUMENTS

| | | |
|---|---|---|
| EP | 2830221 B1 | 2/2017 |
| WO | 2014179944 A1 | 11/2014 |

OTHER PUBLICATIONS

Huott et al., High Performance Data Latching Using an Energy Efficient Clocked Latch Topology, International Business Machines Corporation (IBM), U.S. Appl. No. 18/802,974, filed Aug. 13, 2024, 40 pages.

(Continued)

*Primary Examiner* — Cassandra F Cox

(74) *Attorney, Agent, or Firm* — Onyx IP Group

(57) ABSTRACT

In an embodiment, a latch device includes a latch circuit configured to latch a binary data value based on the functional clock signal being in the active phase and output the binary data value until a different data value is received at a data input node. The latch circuit includes a plurality of gates, including a plurality of clocked gates and a plurality of non-clocked gates. The plurality of clocked gates includes a maximum of three clocked gates. Each of the plurality of non-clocked gates persists in a static state as long as the latch device stores a logic zero and the binary data value at the data input node is logic zero.

20 Claims, 7 Drawing Sheets

(56)    References Cited

U.S. PATENT DOCUMENTS

| | | | |
|---|---|---|---|
| 9,270,270 | B2 | 2/2016 | Cai et al. |
| 9,419,590 | B2 | 8/2016 | Berzins et al. |
| 9,979,381 | B1 | 5/2018 | Rasouli et al. |
| 11,462,263 | B2 * | 10/2022 | Jung ..................... G06F 3/0638 |
| 2006/0161826 | A1 | 7/2006 | Ghisiawan et al. |
| 2007/0033427 | A1 | 2/2007 | Correale et al. |
| 2014/0035645 | A1 * | 2/2014 | Narayanan ............. H03K 3/356 |
| | | | 327/212 |
| 2015/0123722 | A1 | 5/2015 | Sharma et al. |
| 2017/0194943 | A1 * | 7/2017 | Nandi ................... H03K 3/012 |

OTHER PUBLICATIONS

Kumar et al., Comparative analysis of Clock gated Data Look Ahead and Conditional Capture Flip-Flops and their area of Applications, International Journal of Computer Applications (0975 - 8887), National conference on VSLI and Embedded systems 2013, Mar. 2013, 6 pages.
Non-Final Rejection Mailed on Jan. 6, 2026 for U.S. Appl. No. 18/802,974, 7 page(s).

* cited by examiner

101

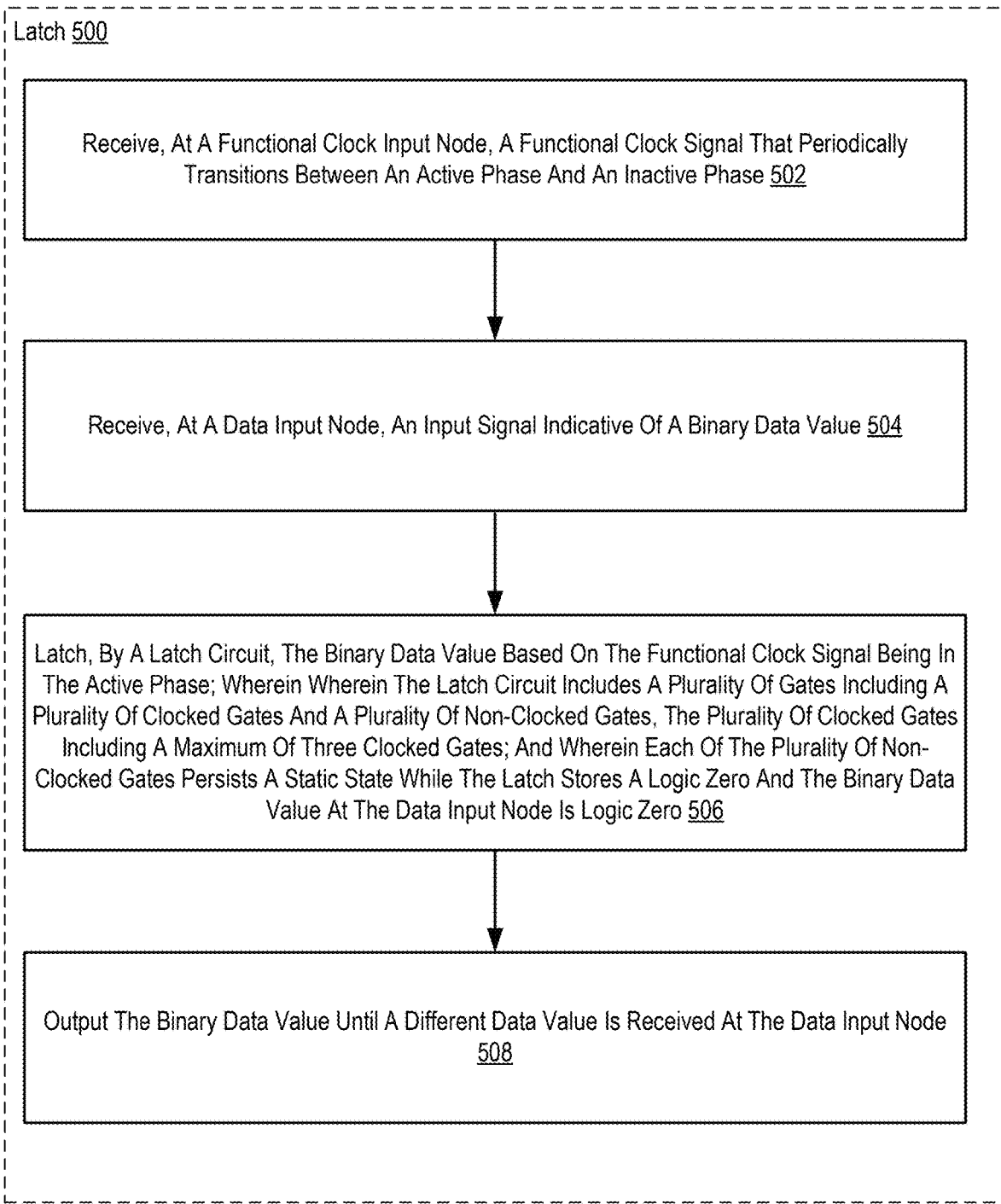

Latch 500

Receive, At A Functional Clock Input Node, A Functional Clock Signal That Periodically Transitions Between An Active Phase And An Inactive Phase 502

Receive, At A Data Input Node, An Input Signal Indicative Of A Binary Data Value 504

Latch, By A Latch Circuit, The Binary Data Value Based On The Functional Clock Signal Being In The Active Phase; Wherein Wherein The Latch Circuit Includes A Plurality Of Gates Including A Plurality Of Clocked Gates And A Plurality Of Non-Clocked Gates, The Plurality Of Clocked Gates Including A Maximum Of Three Clocked Gates; And Wherein Each Of The Plurality Of Non-Clocked Gates Persists A Static State While The Latch Stores A Logic Zero And The Binary Data Value At The Data Input Node Is Logic Zero 506

Output The Binary Data Value Until A Different Data Value Is Received At The Data Input Node 508

FIG. 5

IMPLEMENTING A LOW POWER TOPOLOGY IN A CLOCKED LATCH

BACKGROUND

The present disclosure relates to methods, apparatus, and products for implementing a low power topology in a clocked latch. Total die power (TDP) is a challenging constraint in high frequency chips and microprocessors. The clocking of logic latches within these microprocessors consumes a large percentage of the TDP. Power consumption of clocked latches gets multiplied by the millions of copies of these latches. A small reduction in the power consumption of logic latch circuits can have a large impact on the TDP of the entire chip.

SUMMARY

According to embodiments of the present disclosure, various methods, apparatus and products for implementing a low power topology in a clocked latch are described herein. In a latch topology in accordance with the present disclosure, the low power clocked latch topology reduces the total number of device gates switching with the clock, thus reducing clocked power and consuming less physical area. Further, the non-clocked gates retain their state when the input is a logic zero and the latched value is a logic zero. In this state, internal nodes of the topology do not switch states and only the clocked gates are switching, while still allowing for transparent clocking of data into latch for a level-sensitive design. Because transistor switching consumes power, minimizing the amount of transistor switching in a latch improves power efficiency. Further, because an input of logic zero and a latched logic zero is the typical state of latches in modern microprocessors at any given time, reducing the amount of switching required to maintain the latch in this 'zero state' also contributes to the reduction in power consumed by the latch.

In some aspects, implementing a low power topology in a clocked latch includes a latch device having a functional clock input node configured to receive a functional clock signal that periodically transitions between an active phase and an inactive phase. The latch device also includes a data input node configured to receive an input signal indicative of a binary data value. The latch device also includes a data output node configured to output the binary data value. The latch device also includes a latch circuit comprising a plurality of gates, the latch circuit configured to latch the binary data value based on the functional clock signal being in the active phase and output the binary data value until a different data value is received at the data input node. The plurality of gates includes a plurality of clocked gates and a plurality of non-clocked gates, where the plurality of clocked gates includes a maximum of three clocked gates. Each of the plurality of non-clocked gates persists in a static state while the latch device stores a logic zero and the binary data value at the data input node is logic zero.

BRIEF DESCRIPTION OF THE DRAWINGS

FIG. 5 sets forth a flow chart for an example method of implementing a low power topology in a clocked latch in accordance with at least one embodiment of the present disclosure.

DETAILED DESCRIPTION

Figure 1A:
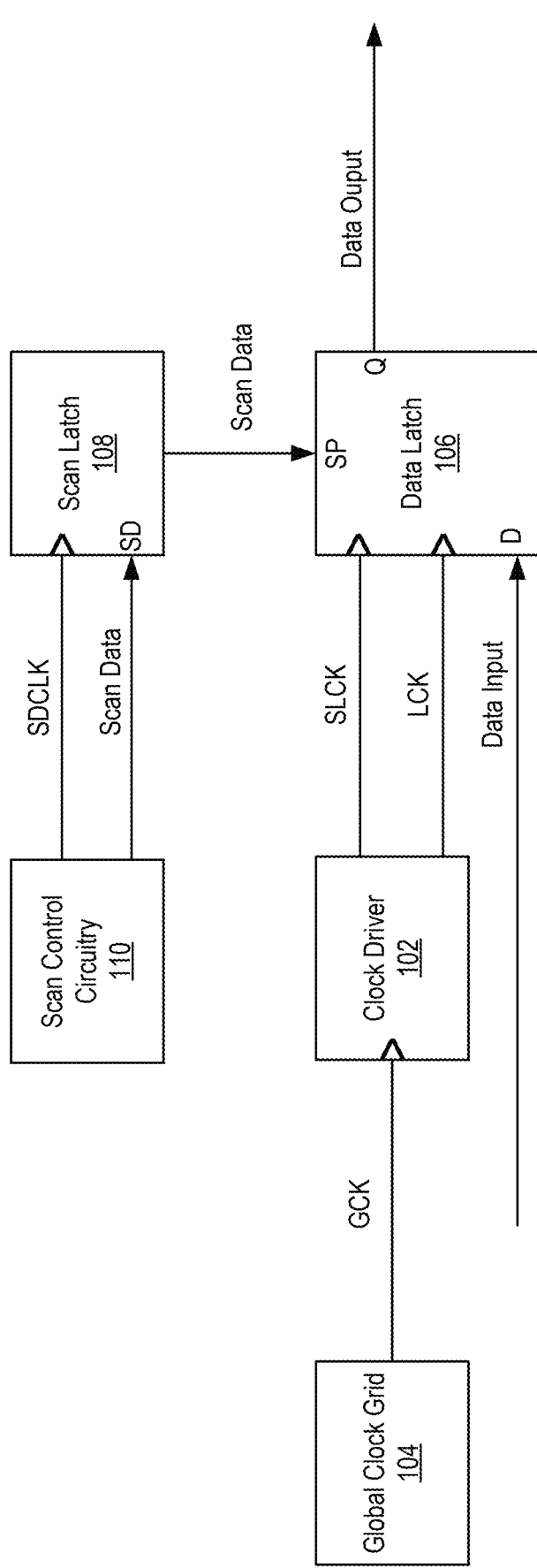
FIG. 1A sets forth an example environment for implementing a low power topology in a clocked latch in accordance with at least one embodiment of the present disclosure.

Synchronous digital systems are described in the context of signals, gates, and logic. As used herein, the terms "high," "active," and "logic one" are used interchangeably to refer to a signal or value that is asserted, where an asserted signal meets, for example, a certain voltage threshold at or near a power reference voltage. The terms "low," "inactive," and "logic zero" are used interchangeably to refer to a signal or value that is not asserted (e.g., having a voltage that is at or near a ground reference voltage. Logic-level descriptions of digital systems are discussed below. It will be appreciated that implementations of logic-level designs, including transistor-level implementations, may vary without departing from the spirit of the present disclosure.

In a synchronous digital system, a clock signal is used to define a time reference for the movement of data within the system. A clock signal oscillates between high and low, corresponding to an active phase and an inactive phase. Depending on system implementation, a clock signal may be considered to be active when the clock signal is high and may be considered to be inactive when the clock signal is low, also referred to as "high active." In other implementations, a clock signal may be considered to be active when the clock signal is low and may be considered to be inactive when the clock signal is high, also referred to as "low active." In the following description, it is assumed that the clock signal is high active, although the principles of the present disclosure are readily adaptable to a low active clock design.

Total die power (TDP) is a challenging constraint in high frequency chips and microprocessors. The clocking of logic latches within these microprocessors consumes a large percentage of the TDP. Power consumption of clocked latches gets multiplied by the millions of copies of these latches. A small reduction in the power consumption of logic latch circuits can have a large impact on the TDP of the entire chip.

Further, the clock distribution network, or clock grid, distributes the clock signal from a common point to all the elements that need the clock signal. Constructing a clock network for microprocessors is becoming increasingly difficult with new process technologies and as circuit complexity increases. In particular, power dissipation has become a limiting factor for the yield of low power, high-performance circuit designs. Clock networks can contribute a large share of the total active power in multi-GHz designs. Low power designs are preferable since they exhibit less power supply noise and provide better tolerance with regard to manufacturing variations.

It is thus advantageous to reduce the total power consumption of clocked latches, and, by extension, the power consumption of the clock network including the global clock grid and local clock drivers. Embodiments in accordance with the present disclosure introduce a clocked latch topology that saves power by reducing the number of clocked gates and improving the power profile of the latch. One application of the topology, among others, is in a scannable latch. A scannable latch is part of the functional data path but also receives scan data in a separate path for the purpose of testing and diagnosing the latches in the microprocessor. However, it will be appreciated that a latch in accordance with the present disclosure is not limited only to such an application.

FIG. 1A sets forth an example scannable latch environment 100 suitable for implementing a low power topology in a clocked latch in accordance with aspects of the present disclosure. The environment includes a clock driver 102 that receives a global clock signal GCK from a global clock grid 104. For example, the clock driver 102 can be a local clock buffer. In some examples, the clock driver 102 provides a functional clock signal LCK and a scan clock signal SCK to at least one data latch 106. However, it will be appreciated that the functional clock signal LCK and the scan clock signal SCK can be provided by separate clock drivers. As part of the functional data path, input data is provided to a data input port D of the data latch 106, which latches the value at input D on the rising edge of the functional clock signal LCK. The latch data is stored and output by the latch on a data output port Q until the latched value is changed by a new data value.

In the example of FIG. 1A, data latch 106 is a scannable latch that is coupled to a scan latch 108 that controls the input of scan data into the data latch. In such an arrangement, data latch 106 is a subordinate L2 latch and scan latch 108 is an L1 latch. The scan latch 108 is coupled to scan control circuitry 110 that provides scan data SD to a scan-in data input of scan latch 108 and provides a scan data clock signal SDCK to the clock input of scan latch 108. During a scan operation, the scan control circuitry 110 launches scan data on scan latch 108, which latches the scan data on the rising edge of the scan data clock signal SDCK. The latched scan data is output via a scan-out data output SO to a scan port SP of the data latch 106. During the scan mode of operation, the scan port of the data latch controls the latch circuitry to latch scan data from the scan port on the rising edge of the scan clock signal SCK and output via the output port of data latch 106. The scan port circuitry is not clocked by the functional clock signal LCK and is only used during a scan operation, and thus it is noted that the scan port circuitry is not part of the functional data path within data latch 106.

Figure 1B:
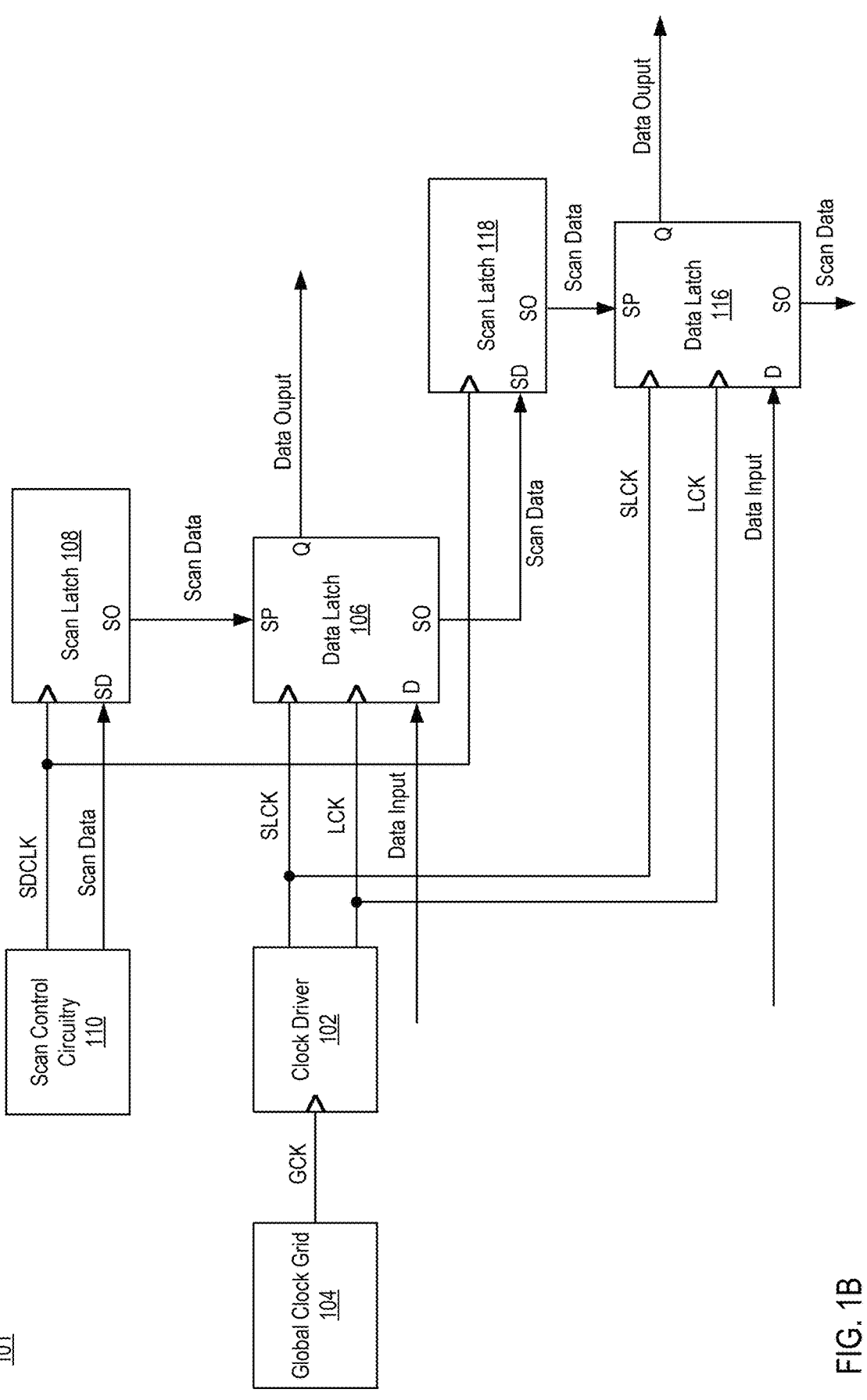
FIG. 1B sets forth another example environment for implementing a low power topology in a clocked latch in accordance with at least one embodiment of the present disclosure.

For further explanation, FIG. 1B sets forth another example of a scannable latch environment 101 suitable for implementing a low power topology in a clocked latch in accordance with aspects of the present disclosure. For testing the interoperability of latches, data latches and scan latches can be daisy chained, where a scan latch receives scan data from a scan out port of a preceding data latch in the chain. The example of FIG. 1B is similar to the example of FIG. 1A but further includes an additional data latch 116 that receives a data input D and also receives the functional clock signal LCK and the scan clock signal SCK from clock driver 102. An additional scan latch 118 receives the scan data from a scan-out data output SO of data latch 106 and passes the scan data into the scan port of data latch 116. In this way, the scan control circuitry 110 can scan data into a string of latches to test the interoperability of the latches. It will be appreciated that more than two scan latches and data latches can be strung together.

Figure 2:
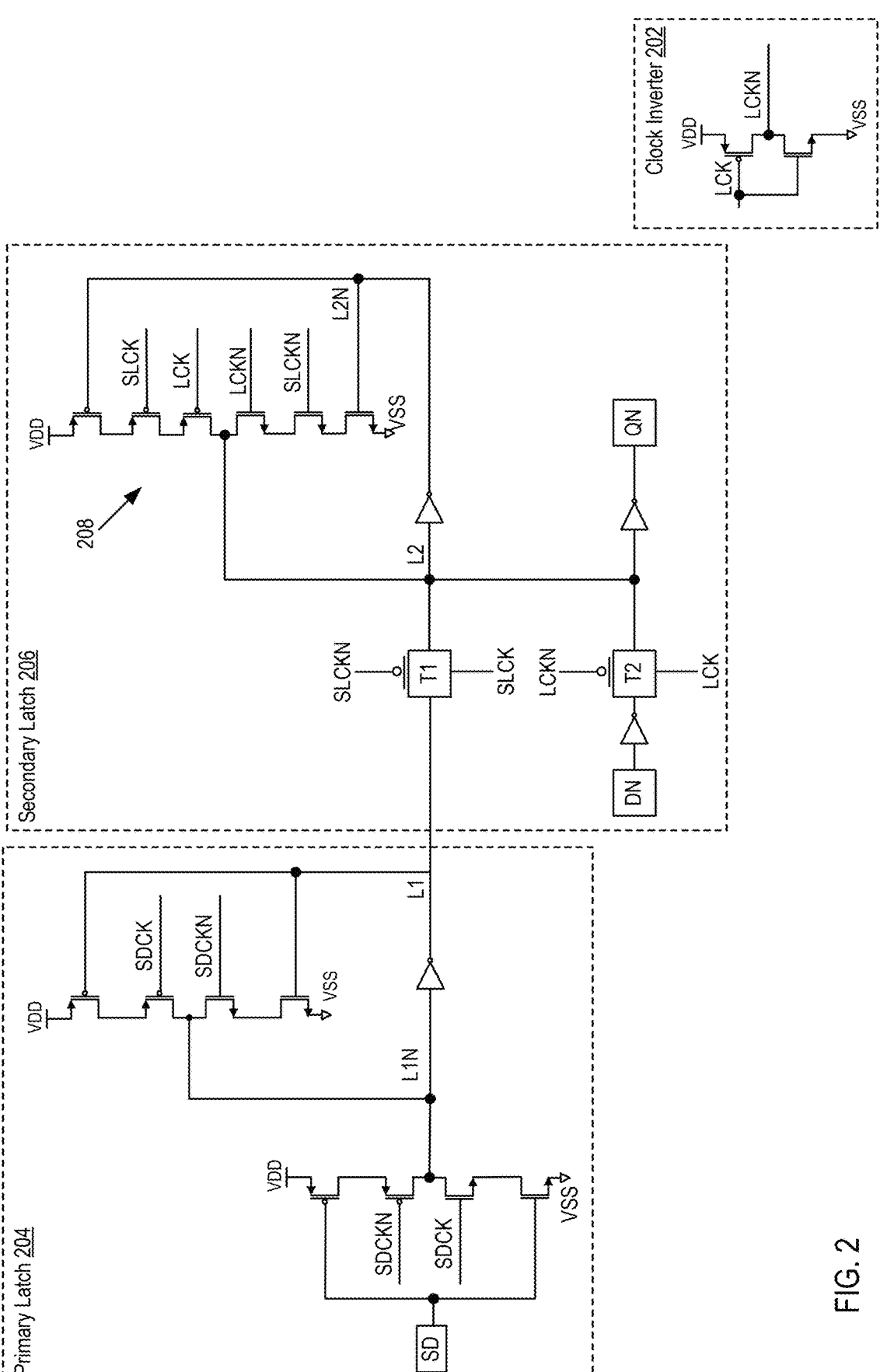
FIG. 2 sets forth an example of a scannable latch configuration.

For further explanation, FIG. 2 illustrates an example arrangement and topology of a primary latch 204 (an L1 latch) and a secondary latch 206 (an L2 latch). The primary latch 204 latches scan data at a scan data input node SD in accordance with the rising edge of the scan data clock signal SDCK. The scan data is output at node L1. The topology of the primary latch 204 as an L1 latch is conventional, and thus further detail of this topology is omitted. A transmission gate T1 controlled by the scan clock signal SLCK and the inverted scan clock signal SLCKN determines whether data at node L1 is scanned into the L2 node of the secondary latch 206.

The secondary latch 206 includes a transmission gate T2 that receives an input D (i.e., an inverted value from input node DN) and provides an output Q, which is inverted an output at output node QN. Transmission gate T2 is clocked by the functional clock signal LCK and the inverted functional clock signal LCKN. Node L2 is coupled to the output of transmission gate T2. A transistor stack 208 coupled to node L2 is operable to latch the value at node L2. When the scan clock signal SLCK is off, transistor stack 208 effectively acts as an inverter. To enable data latching using the transistor stack 208, the transistor stack 208 includes two clocked gates, one clocked by the functional clock signal LCK and one clocked by the inverted functional clock signal LCKN. Further, because the transmission gate T2 and the transistor stack 208 both use the inverted functional clock signal LCKN in addition to the functional clock signal LCK, a clock inverter 202 is employed to generate LCKN from LCK.

It should be noted, then, that the gate topology providing node L2 output in the functional data path utilizes six gates that are clocked by the functional clock signal LCK and the inverted functional cock signal LCKN. The number of clocked gates, which are gates that switch states at every clock edge, is proportional to the power consumed by the latch due to transistor switching. That is, more switching transistors means more power consumed by the latch, and more noise in the circuit due to the transistor switching. Further, gates that are clocked by the functional clock signal or its inverse place a demand on the clock driver that provides that signal. Thus, more switching transistors means more power required from the clock driver, which can mean a larger clock driver or fewer latches operated off of the clock driver.

In accordance with embodiments of the present disclosure, a low power clocked latch topology reduces the total number of device gates switching with the clock down to only three gates, thus reducing clocked power and consuming less physical area. Additionally, the power profile of the low power clocked latch topology is minimized when the clocked data input is logic zero and the latched data is logic zero (i.e., the zero state), which is the predominant clocked state of most latches, thus further reducing power consumption.

The latch arrangement of FIG. 2 is demonstrative of the technical improvement provided by a latch employing a low power clock latch topology in accordance with the present disclosure. By implementing a gate topology using only the functional clock signal, instead of both the functional clock signal LCK and the inverted functional clock signal LCKN, the number of clocked gates in the latch is reduced to three clocked gates, all of which are clocked by only the functional clock signal LCK.

In a latch topology in accordance with the present disclosure, all non-clocked gates retain their state when the input D is a logic zero and the latched value is a logic zero. In this state, internal nodes of the topology do not switch states and only the clocked gates are switching. Because transistor switching consumes power, minimizing the amount of transistor switching in a latch improves power efficiency. Further, because an input of logic zero and a latched logic zero is the typical state of latches in modern microprocessors at any given time, reducing the amount of switching required to maintain the latch in this 'zero state' also contributes to the reduction in power consumed by the latch.

A latch topology in accordance with the present disclosure provides transparent clocking and is thus level sensitive. Accordingly, if the data input changes while the clock signal LCK is in the active phase, that change is immediately propagated to the output node (with minor gate delays). This permits cycle stealing, where a data value can arrive late to the latch and still be latched.

A latch topology in accordance with the present disclosure is free of transmission gates, which reduces the number of gates driven by the clock signal LCK and also reduces the area consumed by the latch. As previously mentioned, minimizing the number of gates driven by the clock signal reduces the amount of power consumed by the clock driver (e.g., a local clock buffer) supplying the clock signal. Minimizing the area consumed by the latch reduces the overall size of the microprocessor given the thousands of latches included in a modern microprocessor design.

Figure 3:
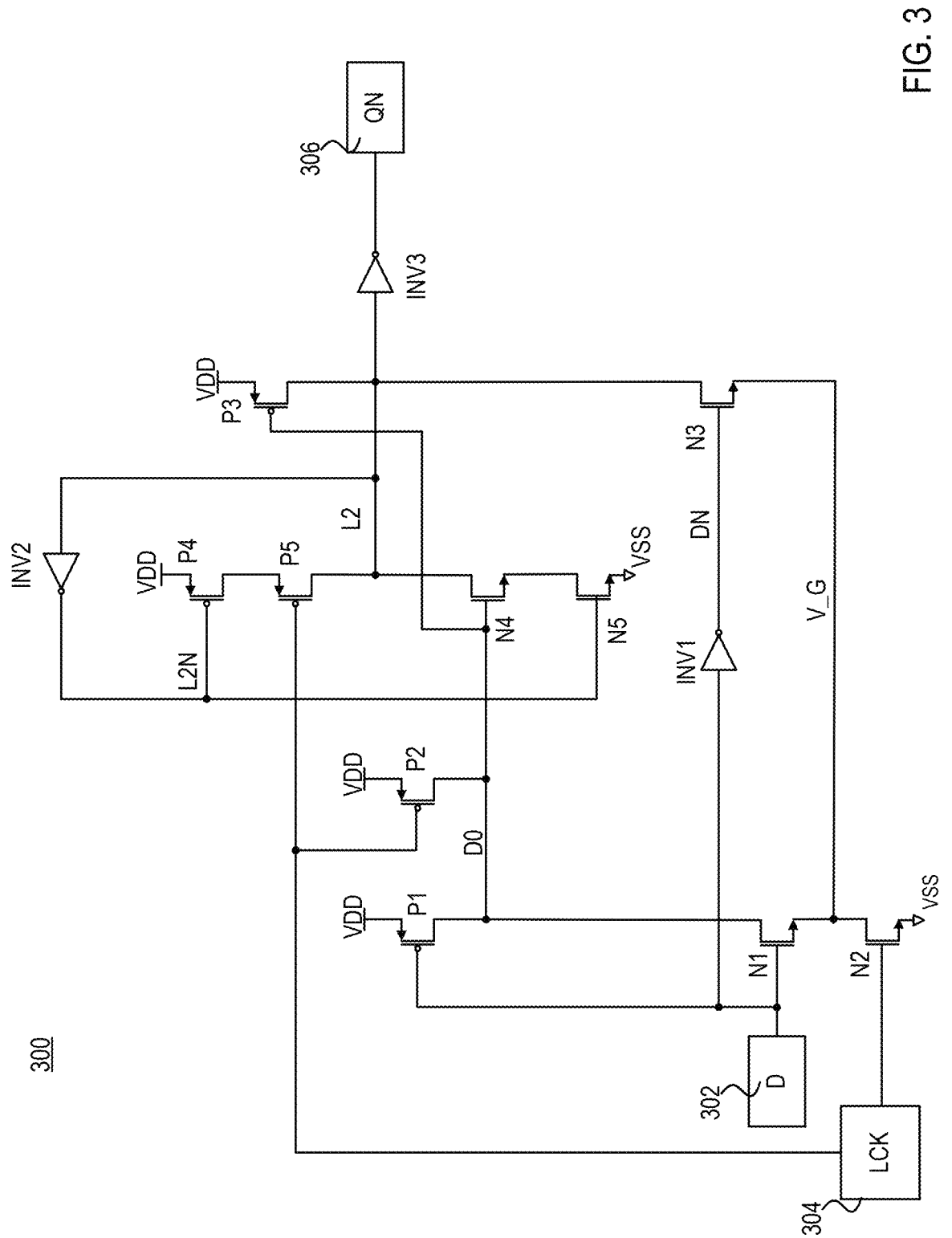
FIG. 3 sets forth an example latch for implementing a low power topology in a clocked latch in accordance with at least one embodiment of the present disclosure.

FIG. 3 illustrates an example latch 300 using a low power clocked latch topology in accordance with at least one embodiment of the present disclosure. The latch 300 includes a data input node 302 that receives functional data input D when the latch is operating in a functional data path. The latch 300 also includes a clock input node 304 that receives a functional clock signal LCK. While the functional clock is turned on for the latch 300, the functional clock signal LCK cycles between active and inactive phases. In the examples below, it is assumed that the clock signal LCK is high active, in that the active phase occurs while the clock signal is asserted high. The clock signal LCK is received from a clock driver. For example, the clock signal LCK can be received from a local clock buffer. The local clock buffer may be gated to turn off the clock signal LCK when the latch 300 and other latches in the same clock domain are not in use. In some examples, the clock signal LCK is a pulsed clock signal. For example, a local clock buffer can pulse the global clock signal received by the local clock buffer using a clock chopping circuit. This pulse clock signal has a shorter active phase than the global clock signal, which can alleviate the risk of updated upstream data values arriving early to the latch 300. The latch 300 also includes an output node 306 that provides the QN output of the latch 300. The QN output is the inverse of the latched input data. It will be appreciated, however, that the output node 306 can instead output the Q output of the latch 300.

The latch topology depicted in FIG. 3 includes a first PFET P1 connected between a power reference (e.g., VDD) and a first internal node D0. The first PFET P1 is gated by input D at the data input node 302. The latch topology also includes a first NFET stack connected between the first internal node D0 and a ground reference (e.g., VSS). The first NFET stack includes a first NFET N1 gated by input D and a second NFET N2 gated by the functional clock signal LCK. In the example of FIG. 2, the drain of the first NFET N1 is coupled to node DO and the source is coupled to the drain of NFET N2, whose source is coupled to VSS. The latch topology also includes a second PFET P2 connected between the power reference and the first internal node D0, where the second PFET P2 is gated by the functional clock signal LCK.

The latch topology depicted in FIG. 3 also includes a third PFET P3 connected between the power reference and a second internal node L2. The third PFET P3 is gated by the value of state of the first internal node D0. The latch topology also includes a third NFET N3 connected between the second internal node L2 and the drain of the second NFET N2. A third internal node V_G lies at the junction of the first NFET N1 and the second NFET N2. Thus, the drain of the third NFET N3 is coupled to the second internal node L2 and the source is connected to V_G. The third NFET N3 is gated by a fourth internal node DN, which is an inversion of input D. Inverter INV1 inverts input D from the data input node 302 and outputs the inverted value at DN.

The latch topology of FIG. 3 also includes a storage circuit configured to persist a value of the second internal node L2. That is, the storage circuit outputs the latched input data while the functional clock signal is in both the active and inactive phase until a new data value is latched into the storage circuit. The value of the second internal node L2 is inverted and output to a fifth internal node L2N (i.e., L2-Not). In the example of FIG. 3, the storage circuit includes a first PFET stack connected between the power reference and the second internal node L2. The first PFET stack includes a fourth PFET P4 gated by the fifth internal node L2N (i.e., the inverted state of the second internal node L2). The first PFET stack also includes a fifth PFET P5 gated by the functional clock signal LCK. Thus, the source of PFET P4 is coupled to VDD and the drain is coupled to the source of PFET P5, whose drain is coupled to internal node L2. The storage circuit also includes a second NFET stack connected between the second internal node L2 and the ground reference. The second NFET stack includes a fourth NFET N4 gated by the state of the first internal node D0 and a fifth NFET N5 gated by L2N. Thus, the drain of NFET N4 is coupled to the second internal node L2 and the source is connected to the drain of NFET N5, whose source is coupled to VSS.

The latch 300 functions as a zero-state NOR, where no state changes occur in the non-clocked gates as long as the latched value is logic zero and the input value being clocked in is a logic zero. Thus, this topology conserves power by reducing the number of clocked gates and also by reducing the number of devices that are switching when the latch is in this state, i.e., where there is a logic zero input and logic zero latched, which is the typical state of most latches in a modern microprocessor at any given time. Advantageously, state changes in the non-clocked gates are inhibited without using additional logic to gate the clock signal based on a comparison of the latched value to the next input value.

It will be appreciated from the following that node D0 does not change state with the clock when the latched value is logic zero and the input D is a logic zero. Beginning with a logic zero at input D, when input D is low (logic zero) and clock LCK is high, NFET N2 is turned on by LCK and NFET N1 is turned off by input D, thus disconnecting node DO from VSS. PFET P1 is turned on by input D, thus holding node D0 high; meanwhile, PFET P2 is turned off. Input D is inverted by inverter INV1, which pulls node DN high and thus turns on NFET N3. NFET N2 pulls node V_G low. Thus, node L2 is pulled low through NFET N3 and NFET N2. Because node D0 is high, PFET P3 is turned off so that there is no contention with NFET N3 at node L2.

Thus, node L2 is in phase with input D. Node L2 is inverted by inverter INV3 to yield the QNOT output of the latch, which is typically used over the Q output as it results in less noise.

It is observed that the latch has latched a value of logic zero at node L2 and logic zero remains on input D. When LCK goes low, NFET N2 is turned off, while node D0 being held high by PFET P1 keeps PFET P3 turned off. The logic zero at node L2 is inverted by inverter INV2, yielding logic one at node L2N. This turns on NFET N5, and the logic one at DO also turns on NFET N4. Thus, this NFET stack pulls down and keeps node L2 at logic zero. To remove contention at L2, the logic one at node L2N also turns off PFET P4, thus also disconnecting VDD at node L2 (PFET P5 is also off).

It is observed that, as LCK toggles between high and low, a logic zero clocked in from input D while a logic zero is already latched will keep node DO from toggling with LCK; that is, node D0 is held high regardless of clock phase. Accordingly, whenever the latch clocks in another logic zero, NFET N1, NFET N3, NFET N4, NFET N5, NFET N6, PFET P1, PFET P3, and PFET P4 will not switch states, thus saving power. In other words, all non-clocked gates will persist in a static state as long as the input is logic zero and the latched value is logic zero. In this way, the power consumption of the latch is minimized given that this zero state is the most common state among latches at any given time.

When input D goes to a logic one from logic zero and the clock is high, PFET P1 is turned off, NFET N1 and NFET N2 are turned on, and node D0 is pulled low. NFET N3 is turned off because DN becomes logic zero and NFET N4 is turned off because node D0 is low. Meanwhile, PFET P3 is turned on because node D0 is low. This allows PFET P3 to pull up on node L2. When the clock goes low, the logic one remains latched as node L2N turns on PFET P4 and turns off NFET N5, and the low clock turns on PFET P5, thus ensuring that L2 remains at logic one.

It will be appreciated from the foregoing that the latch implemented by the latch topology in FIG. 3 uses only three clocked gates. Minimizing the number of gates driven by clock signal LCK reduces the number of gates that are switching, and thus reduces the amount of power consumed by the latch. Further, minimizing the number of gates driven by the clock signal reduces the amount of power consumed by the clock driver (e.g., a local clock buffer) supplying the clock signal. Given the enormous number of latches in modern microprocessor designs, this results in substantial power savings.

It will be appreciated from the foregoing that, in the latch implemented by the latch topology in FIG. 3, all non-clocked gates retain their state when the input D is a logic zero and the latched value is a logic zero. Because node D0 does not toggle with the clock signal LCK when the input D is a logic zero and the latched value is a logic zero, all gates driven by node D0 also do not switch states. Further, the value at node L2 does not change, thus all gates driven by node L2 do not switch states. Because input D remains logic zero, all gates driven by input D or the inverse of input D do not switch states. Because transistor switching consumes power, minimizing the amount of transistor switching in a latch conserves power. Further, because an input of logic zero and a latched logic zero is the typical state of latches in modern microprocessors at any given time, reducing the amount of switching required to maintain the latch in this 'zero state' also contributes to the reduction in power consumed by the latch.

It will be appreciated from the foregoing that the latch implemented by the latch topology in FIG. 3 provides transparent clocking and is thus level sensitive. Accordingly, as input D changes while the clock signal LCK is high, that change is immediately propagated to node L2 (with minor gate delays).

It will be appreciated that the latch topology of FIG. 3 is free of transmission gates, which reduces the number of gates driven by the clock signal LCK and also reduces the area consumed by the latch. As previously mentioned, minimizing the number of gates driven by the clock signal reduces the amount of power consumed by the clock driver (e.g., a local clock buffer) supplying the clock signal. Minimizing the area consumed by the latch reduces the overall size of the microprocessor given the enormous number of latches included in a modern microprocessor design.

Figure 4:
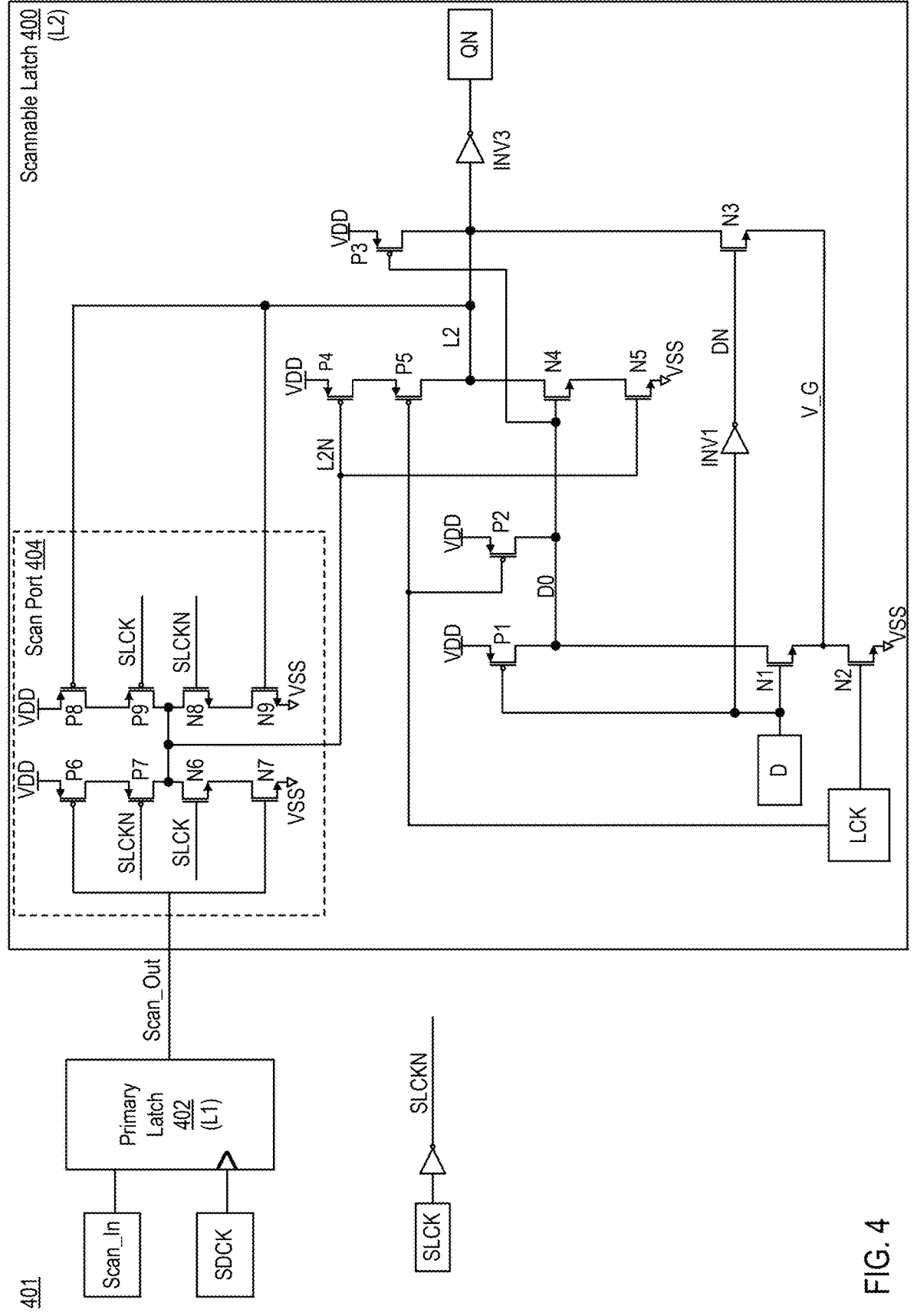
FIG. 4 sets forth another example latch for implementing a low power topology in a clocked latch in accordance with at least one embodiment of the present disclosure.

FIG. 4 sets forth a system 401 for a scannable latch 400 that uses a low power clocked latch topology in accordance with at least one embodiment of the present disclosure. In the example of FIG. 3, the scannable latch 400 is similar to the latch 300 of FIG. 3 except that the inverter INV2 in FIG. 3 is replaced with a scan port 404. The latch 300 receives, in addition to functional clock signal LCK, a scan clock signal SLCK and an inverted scan clock signal SLCKN, as well as a scan out signal Scan_Out that transmits scan data into the scan port 404 of the scannable latch 400. In the example of FIG. 4, scannable latch 400 is a subordinate latch (i.e., an L2 latch) of a primary latch 402 (i.e., an L1 latch). Both the primary latch 402 and the subordinate scannable latch 400 are clocked D-type latches. The primary latch 402 includes a scan data input node Scan_In and latches a value of the scan data input based on a scan data clock signal SDCK. The latched scan data is output to scan port 404 of the scannable latch via the scan out signal Scan_Out. In some examples, the scan data clock signal SDCK is out of phase with the scan clock signal SLCK, thus scan data latched by the primary latch 402 during the active state of the scan data clock signal SDCK is ready by the scannable latch 400 during the inactive state of the scan data clock signal SDCK (i.e., the active state of the scan clock signal SLCK.

The scan port 404 is connected to node L2 and node L2N of the scannable latch 400. In this way, scan data can be read into the scannable latch 400. The scan port 404 includes a stack of PFETs P6, P7 connected in series between VDD and node L2N. PFET P6 is gated by Scan_Out while PFET P7 is gated by SLCKN. The scan port 404 also includes a stack of NFETs N6, N7 connected in series between node L2N and VSS. NFET N6 is gated by SLCK while NFET N7 is gated by Scan_Out. The scan port 404 also includes a stack of PFETs P8, P9 connected in series between VDD and node L2N. PFET P8 is gated by node L2 while PFET P9 is gated by SLCK. The scan port 404 also includes a stack of NFETs N8, N9 connected in series between node L2N and VSS. NFET N8 is gated by SLCKN while NFET N9 is gated by node L2.

When scan clock signal SLCK is off (e.g., held in steady state inactive), PFET P8 and NFET N9 act as an inverter of node L2, while PFET P7 and NFET N6 on the scan data side are turned off. Thus, the operation of the scannable latch 400 is the same as described above with reference to FIG. 3. However, when scan clock signal SLCK is on (e.g., transitioning between active and inactive states), the scan port 404 controls the value at node L2 by controlling node L2N, thus allowing scan data to be passed into the latch.

Accordingly, systems utilizing scannable latches benefit from the low power clocked latch topology. A latch employing a low power clocked latch topology in accordance with the present disclosure is made scannable by adding a scan port, while still retaining the above-described advantages while the latch operates in the functional data path.

For further explanation, FIG. 5 sets forth a flow chart of an example method of implementing a low power topology in a clocked latch in accordance with at least one embodiment of the present disclosure. The example of FIG. 5 includes a latch 500. In some examples, the latch 500 is configured like the example latch 300 of FIG. 3 or the example scannable latch 400 of FIG. 4. The method of FIG. 5 includes receiving 502, at a functional clock input node, a functional clock signal that periodically transitions between an active phase and an inactive phase. In some examples, the latch 500 receives a functional clock signal by receiving a local clock signal from a local clock buffer.

The method of FIG. 5 also includes receiving 504, at a data input node, an input signal indicative of a binary data value. In some examples, the latch 500 receives 504 a binary data value from a data bus or upstream latch. For example, the latch may be part of a register, and the binary data value is a value to be written to the register.

The method of FIG. 5 also includes latching 506, by a latch circuit, the binary data value based on the functional clock signal being in the active phase. In some examples, when the functional clock signal is high, the latch 500 will latch any value presented at the input node into the latch circuitry. The latch does not latch a data value while the clock signal is low. As discussed above with reference to FIG. 3, the latch circuit includes a plurality of gates including a plurality of clocked gates and a plurality of non-clocked gates, the plurality of clocked gates including a maximum of three clocked gates. Each of the plurality of non-clocked gates persists in a static state while the latch stores a logic zero and the binary data value at the data input node is logic zero.

The method of FIG. 5 also includes outputting 508 the binary data value until a different data value is received at the data input node. For example, if a logic zero is latched, the latch 500 will continue to output a logic zero during both active and inactive phases of the functional clock signal until a new value is received, e.g., at the data input or the scan port.

In view of the foregoing, it will be appreciated that embodiments in accordance with the present disclosure provide a number of advantages, including reducing the clock switching device gates in the latch to only three gates, saving overall clocked power and reducing load on the clock buffer); significantly reducing the power profile of the latch for the predominant zero state; reducing physical area of the design due in part to the elimination of transmission gates and a clock inverter; and allowing cycle stealing (i.e., real-adjust) data arrival timing compared to the clock signal, among other advantages.

Figure 6:
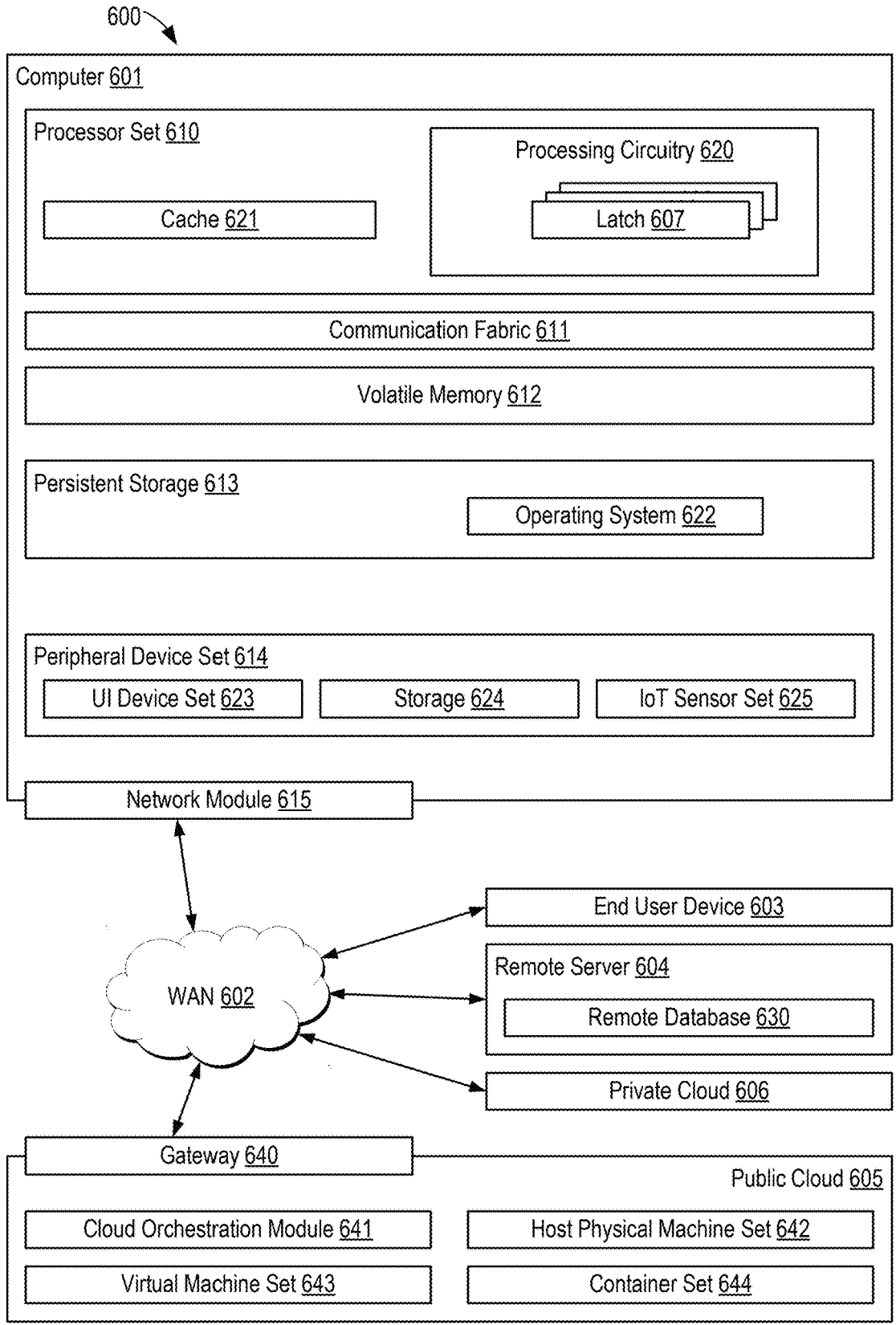
FIG. 6 sets forth an example computing environment according to aspects of the present disclosure.

FIG. 6 sets forth an example computing environment according to aspects of the present disclosure. Computing environment 600 contains an example of an environment for the execution of computer code. Computing environment 600 includes, for example, computer 601, wide area network (WAN) 602, end user device (EUD) 603, remote server 604, public cloud 605, and private cloud 606. In this embodiment, computer 601 includes processor set 610 (including processing circuitry 620 and cache 621), communication fabric 611, volatile memory 612, persistent storage 613 (including operating system 622, as identified above), peripheral device set 614 (including user interface (UI) device set 623, storage 624, and Internet of Things (IoT) sensor set 625), and network module 615. Remote server 604 includes remote database 630. Public cloud 605 includes gateway 640, cloud orchestration module 641, host physical machine set 642, virtual machine set 643, and container set 644.

Computer 601 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 630. As is well understood in the art of computer technology, and depending upon the technology, performance of a computer-implemented method may be distributed among multiple computers and/or between multiple locations. On the other hand, in this presentation of computing environment 600, detailed discussion is focused on a single computer, specifically computer 601, to keep the presentation as simple as possible. Computer 601 may be located in a cloud, even though it is not shown in a cloud in FIG. 6. On the other hand, computer 601 is not required to be in a cloud except to any extent as may be affirmatively indicated.

Processor set 610 includes one, or more, computer processors of any type now known or to be developed in the future. Processing circuitry 620 may be distributed over multiple packages, for example, multiple, coordinated integrated circuit chips. Processing circuitry 620 may implement multiple processor threads and/or multiple processor cores. Cache 621 is memory that is located in the processor chip package(s) and is typically used for data or code that should be available for rapid access by the threads or cores running on processor set 610. Cache memories are typically organized into multiple levels depending upon relative proximity to the processing circuitry. Alternatively, some, or all, of the cache for the processor set may be located "off chip." In some computing environments, processor set 610 may be designed for working with qubits and performing quantum computing. Processing circuitry 620 includes at least one latch 607 for implementing a low power topology in a clocked latch in accordance with embodiments of the preset disclosure described above.

Computer readable program instructions are typically loaded onto computer 601 to cause a series of operational steps to be performed by processor set 610 of computer 601 and thereby effect a computer-implemented method, such that the instructions thus executed will instantiate the methods specified in flowcharts and/or narrative descriptions of computer-implemented methods included in this document. These computer readable program instructions are stored in various types of computer readable storage media, such as cache 621 and the other storage media discussed below. The program instructions, and associated data, are accessed by processor set 610 to control and direct performance of the computer-implemented methods. In computing environment 600, at least some of the instructions for performing the computer-implemented methods may be stored in persistent storage 613.

Communication fabric 611 is the signal conduction path that allows the various components of computer 601 to communicate with each other. Typically, this fabric is made of switches and electrically conductive paths, such as the switches and electrically conductive paths that make up buses, bridges, physical input/output ports and the like.

Other types of signal communication paths may be used, such as fiber optic communication paths and/or wireless communication paths.

Volatile memory 612 is any type of volatile memory now known or to be developed in the future. Examples include dynamic type random access memory (RAM) or static type RAM. Typically, volatile memory 612 is characterized by random access, but this is not required unless affirmatively indicated. In computer 601, the volatile memory 612 is located in a single package and is internal to computer 601, but, alternatively or additionally, the volatile memory may be distributed over multiple packages and/or located externally with respect to computer 601.

Persistent storage 613 is any form of non-volatile storage for computers that is now known or to be developed in the future. The non-volatility of this storage means that the stored data is maintained regardless of whether power is being supplied to computer 601 and/or directly to persistent storage 613. Persistent storage 613 may be a read only memory (ROM), but typically at least a portion of the persistent storage allows writing of data, deletion of data and re-writing of data. Some familiar forms of persistent storage include magnetic disks and solid state storage devices. Operating system 622 may take several forms, such as various known proprietary operating systems or open source Portable Operating System Interface-type operating systems that employ a kernel.

Peripheral device set 614 includes the set of peripheral devices of computer 601. Data communication connections between the peripheral devices and the other components of computer 601 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 623 may include components such as a display screen, speaker, microphone, wearable devices (such as goggles and smart watches), keyboard, mouse, printer, touchpad, game controllers, and haptic devices. Storage 624 is external storage, such as an external hard drive, or insertable storage, such as an SD card. Storage 624 may be persistent and/or volatile. In some embodiments, storage 624 may take the form of a quantum computing storage device for storing data in the form of qubits. In embodiments where computer 601 is required to have a large amount of storage (for example, where computer 601 locally stores and manages a large database), this storage may be provided by peripheral storage devices designed for storing very large amounts of data, such as a storage area network (SAN) that is shared by multiple, geographically distributed computers. IoT sensor set 625 is made up of sensors that can be used in Internet of Things applications. For example, one sensor may be a thermometer and another sensor may be a motion detector.

Network module 615 is the collection of computer software, hardware, and firmware that allows computer 601 to communicate with other computers through WAN 602. Network module 615 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 615 are performed on the same physical hardware device. In other embodiments (for example, embodiments that utilize software-defined networking (SDN)), the control functions and the forwarding functions of network module 615 are performed on physically separate devices, such that the control functions manage several different network hardware devices. Computer readable program instructions for performing the computer-implemented methods can typically be downloaded to computer 601 from an external computer or external storage device through a network adapter card or network interface included in network module 615.

WAN 602 is any wide area network (for example, the internet) capable of communicating computer data over non-local distances by any technology for communicating computer data, now known or to be developed in the future. In some embodiments, the WAN 602 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 603 is any computer system that is used and controlled by an end user (for example, a customer of an enterprise that operates computer 601), and may take any of the forms discussed above in connection with computer 601. EUD 603 typically receives helpful and useful data from the operations of computer 601. For example, in a hypothetical case where computer 601 is designed to provide a recommendation to an end user, this recommendation would typically be communicated from network module 615 of computer 601 through WAN 602 to EUD 603. In this way, EUD 603 can display, or otherwise present, the recommendation to an end user. In some embodiments, EUD 603 may be a client device, such as thin client, heavy client, mainframe computer, desktop computer and so on.

Remote server 604 is any computer system that serves at least some data and/or functionality to computer 601. Remote server 604 may be controlled and used by the same entity that operates computer 601. Remote server 604 represents the machine(s) that collect and store helpful and useful data for use by other computers, such as computer 601. For example, in a hypothetical case where computer 601 is designed and programmed to provide a recommendation based on historical data, then this historical data may be provided to computer 601 from remote database 630 of remote server 604.

Public cloud 605 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 605 is performed by the computer hardware and/or software of cloud orchestration module 641. The computing resources provided by public cloud 605 are typically implemented by virtual computing environments that run on various computers making up the computers of host physical machine set 642, which is the universe of physical computers in and/or available to public cloud 605. The virtual computing environments (VCEs) typically take the form of virtual machines from virtual machine set 643 and/or containers from container set 644. It is understood that these VCEs may be stored as images and may be transferred among and between the various physical machine hosts, either as images or after instantiation of the VCE. Cloud orchestration module 641 manages the transfer and storage of images, deploys new instantiations of VCEs and manages active instantiations of VCE deployments. Gateway 640 is the collection of computer software, hardware, and firmware that allows public cloud 605 to communicate through WAN 602.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 606 is similar to public cloud 605, except that the computing resources are only available for use by a single enterprise. While private cloud 606 is depicted as being in communication with WAN 602, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 605 and private cloud 606 are both part of a larger hybrid cloud.

In view of the foregoing, it will be appreciated that implementing a low power topology in a clocked latch in accordance with the present disclosure provides a number of advantages. In one example of an embodiment of the claimed invention, a latch device includes a functional clock input node configured to receive a functional clock signal that periodically transitions between an active phase and an inactive phase. The latch device also includes a data input node configured to receive an input signal indicative of a binary data value. The latch device also includes a data output node configured to output the binary data value. The latch device also includes a latch circuit comprising a plurality of gates, the latch circuit configured to: latch the binary data value based on the functional clock signal being in the active phase and output the binary data value until a different data value is received at the data input node. The plurality of gates includes a plurality of clocked gates and a plurality of non-clocked gates, the plurality of clocked gates including a maximum of three clocked gates. Each of the plurality of non-clocked gates persists in a static state across clock transitions while the latch device stores a logic zero and the binary data value at the data input node is logic zero. In this way, a low power clocked latch topology reduces the total number of device gates switching with the clock down to only three gates, thus reducing clocked power and consuming less physical area. Additionally, the power profile of the low power clocked latch topology is minimized when the clocked data input is logic zero and the latched data is logic zero (i.e., the zero state), which is the predominant clocked state of most latches, thus further reducing power consumption. Because transistor switching consumes power, minimizing the amount of transistor switching in a latch improves power efficiency. Further, because an input of logic zero and a latched logic zero is the typical state of latches in modern microprocessors at any given time, reducing the amount of switching required to maintain the latch in this 'zero state' also contributes to the reduction in power consumed by the latch.

In some variations of the embodiment, the latch circuit is configured to output a change in the data value when the data value at the data input node changes during the active phase of the functional clock signal. In these examples, a latch topology in accordance with the present disclosure provides transparent clocking and is thus level sensitive. Accordingly, if the data input changes while the clock signal is in the active phase, that change is immediately propagated to the output node (with minor gate delays). This permits cycle stealing, where a data value can arrive late to the latch and still be latched.

In some variations of the embodiment, the latch device is free of transmission gates. This reduces the number of gates driven by the clock signal and also reduces the area consumed by the latch. As previously mentioned, minimizing the number of gates driven by the clock signal reduces the amount of power consumed by the clock driver (e.g., a local clock buffer) supplying the clock signal. Minimizing the area consumed by the latch reduces the overall size of the microprocessor given the thousands of latches included in a modern microprocessor design.

In some variations of the embodiment, each of the plurality of clocked gates receives the functional clock signal. By implementing a gate topology using only the functional clock signal, instead of both the functional clock signal and the inverted functional clock signal, the number of clocked gates in the latch is reduced to three clocked gates, all of which are clocked by only the functional clock signal.

In some variations of the embodiment, the plurality of gates includes a first PFET connected between a power reference and a first internal node, wherein first PFET is gated by the binary data value of the data input node. The plurality of latches also includes a first NFET stack connected between the first internal node and a ground reference, the first NFET stack including a first NFET gated by the binary data value of the data input node and a second NFET gated by a functional clock signal. The plurality of latches also includes a second PFET connected between the power reference and the first internal node, where the second PFET is gated by the functional clock signal. The plurality of latches further includes a third PFET connected between the power reference and a second internal node, where the third PFET is gated by a state of the first internal node. The plurality of latches also includes a third NFET connected between the second internal node and the second NFET, where the third NFET is gated by an inversion of the binary data value of the data input node. The plurality of latches further includers a storage circuit configured to persist a value of the second internal node while the functional clock signal is in the inactive phase. The data value output by the latch circuit is based on the value of the second internal node. Using this topology, a low power clocked latch reduces the total number of device gates switching with the clock down to only three gates, thus reducing clocked power and consuming less physical area. Additionally, the power profile of the low power clocked latch topology is minimized when the clocked data input is logic zero and the latched data is logic zero (i.e., the zero state), which is the predominant clocked state of most latches, thus further reducing power consumption.

In some variations of the embodiment, the storage circuit includes a first PFET stack connected between the power reference and the second internal node, the first PFET stack including a fourth PFET gated by an inverted state of the second internal node and a fifth PFET gated by the functional clock signal. The storage circuit also includes a second NFET stack connected between the second internal node and the ground reference, the second NFET stack including a fourth NFET gated by the state of the first internal node and a fifth NFET gated by the inverted state of the second internal node. In some examples, the plurality of clocked gates consists of the second NFET, the second PFET, and the fifth PFET.

In another example of an embodiment of the claimed invention, an apparatus includes a first latch includes a functional clock input node configured to receive a functional clock signal that cycles between an active phase and an inactive phase, a scan clock input node configured to receive a scan clock signal, a functional data input node configured to receive an input signal indicative of a binary data value, and a scan port configured to receive scan data. The first latch also includes a latch circuit comprising a plurality of gates, the latch circuit configured to latch the binary data value based on the functional clock signal being in the active phase and output the binary data value until a different data value is received by the latch circuit. The plurality of gates includes a plurality of clocked gates and a plurality of non-clocked gates, the plurality of clocked gates including a maximum of three clocked gates the latch circuit preserves a static state in the plurality of non-clocked gates across clock transitions as long as a data value at the functional data input node matches a latched data value. The scan port is further configured to input the scan data into the latch circuit based on the scan clock signal. In this way, systems utilizing scannable latches benefit from the low power clocked latch topology in accordance with the present disclosure.

In some variations of the embodiment, the apparatus also includes a second latch configured to receive a scan data clock signal and the scan data, latch the scan data during an active phase of the scan data clock signal, and output the latched scan data to the scan port of the first latch.

In another example of an embodiment of the claimed invention, a method includes receiving, at a functional clock input node, a functional clock signal that periodically transitions between an active phase and an inactive phase. The method also includes receiving, at a data input node, an input signal indicative of a binary data value. The method also includes latching, by a latch circuit, the binary data value based on the functional clock signal being in the active phase. The method also includes outputting the binary data value until a different data value is received at the data input node. The latch circuit includes a plurality of gates including a plurality of clocked gates and a plurality of non-clocked gates, the plurality of clocked gates including a maximum of three clocked gates. Each of the plurality of non-clocked gates persists in a static state across clock transitions while the latch device stores a logic zero and the binary data value at the data input node is logic zero.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A latch device comprising:
    a functional clock input node configured to receive a functional clock signal that periodically transitions between an active phase and an inactive phase;
    a data input node configured to receive an input signal indicative of a binary data value;
    a data output node configured to output the binary data value; and a latch circuit comprising a plurality of gates, the latch circuit configured to:

latch the binary data value based on the functional clock signal being in the active phase; and output the binary data value until a different data value is received at the data input node;

wherein the plurality of gates includes a plurality of clocked gates and a plurality of non-clocked gates, the plurality of clocked gates including a maximum of three clocked gates; and wherein each of the plurality of non-clocked gates persists in a static state across clock transitions while the latch device stores a logic zero and the binary data value at the data input node is logic zero.

2. The latch device of claim 1, wherein the latch circuit is configured to output a change in the binary data value when the binary data value at the data input node changes during the active phase of the functional clock signal.

3. The latch device of claim 1, wherein the latch device is free of transmission gates.

4. The latch device of claim 1, wherein each of the plurality of clocked gates receives the functional clock signal.

5. The latch device of claim 1, wherein the plurality of gates includes:

a first PFET connected between a power reference and a first internal node, wherein first PFET is gated by the binary data value of the data input node;

a first NFET stack connected between the first internal node and a ground reference, the first NFET stack including a first NFET gated by the binary data value of the data input node and a second NFET gated by a functional clock signal;

a second PFET connected between the power reference and the first internal node, wherein the second PFET is gated by the functional clock signal;

a third PFET connected between the power reference and a second internal node, wherein the third PFET is gated by a state of the first internal node;

a third NFET connected between the second internal node and the second NFET, wherein the third NFET is gated by an inversion of the binary data value of the data input node; and a storage circuit configured to persist a value of the second internal node while the functional clock signal is in the inactive phase;

wherein the data value output by the latch circuit is based on the value of the second internal node.

6. The latch device of claim 5, wherein the storage circuit includes:

a first PFET stack connected between the power reference and the second internal node, the first PFET stack including a fourth PFET gated by an inverted state of the second internal node and a fifth PFET gated by the functional clock signal; and a second NFET stack connected between the second internal node and the ground reference, the second NFET stack including a fourth NFET gated by the state of the first internal node and a fifth NFET gated by the inverted state of the second internal node.

7. The latch device of claim 6, wherein the plurality of clocked gates consists of the second NFET, the second PFET, and the fifth PFET.

8. An apparatus comprising:

a first latch including:

a functional clock input node configured to receive a functional clock signal that cycles between an active phase and an inactive phase;

a scan clock input node configured to receive a scan clock signal;

a functional data input node configured to receive an input signal indicative of a binary data value;

a data output node configured to output data;

a latch circuit comprising a plurality of gates, the latch circuit configured to:

latch the binary data value based on the functional clock signal being in the active phase; and output the binary data value until a different data value is received by the latch circuit; and a scan port configured to input scan data into the latch circuit based on the scan clock signal;

wherein the plurality of gates includes a plurality of clocked gates and a plurality of non-clocked gates, the plurality of clocked gates including a maximum of three clocked gates; and wherein each of the plurality of non-clocked gates persists in a static state across clock transitions while the latch device stores a logic zero and the binary data value at the data input node is logic zero.

9. The apparatus of claim 8 further comprising a second latch configured to:

receive a scan data clock signal and the scan data;

latch the scan data during an active phase of the scan data clock signal; and output the latched scan data to the scan port of the first latch.

10. The apparatus of claim 8 wherein the latch circuit is configured to output a change in the binary data value when the binary data value at the functional data input node changes during the active phase of the functional clock signal.

11. The apparatus of claim 8, wherein the first latch is free of transmission gates.

12. The apparatus of claim 8, wherein each of the plurality of clocked gates receives the functional clock signal.

13. The apparatus of claim 8, wherein the plurality of gates includes:

a first PFET connected between a power reference and a first internal node, wherein first PFET is gated by the binary data value of the functional data input node;

a first NFET stack connected between the first internal node and a ground reference, the first NFET stack including a first NFET gated by the binary data value of the functional data input node and a second NFET gated by a functional clock signal;

a second PFET connected between the power reference and the first internal node, wherein the second PFET is gated by the functional clock signal;

a third PFET connected between the power reference and a second internal node, wherein the third PFET is gated by a state of the first internal node;

a third NFET connected between the second internal node and the second NFET, wherein the third NFET is gated by an inversion of the binary data value of the functional data input node; and a storage circuit configured to persist a value of the second internal node while the functional clock signal is in the inactive phase;

wherein the data value output by the latch circuit is based on the value of the second internal node.

14. The apparatus of claim 13, wherein the storage circuit includes:

a first PFET stack connected between the power reference and the second internal node, the first PFET stack including a fourth PFET gated by an inverted state of the second internal node and a fifth PFET gated by the functional clock signal; and a second NFET stack connected between the second internal node and the ground reference, the second NFET stack including a fourth NFET gated by the state of the first internal node and a fifth NFET gated by the inverted state of the second internal node.

15. The apparatus of claim 14, wherein the plurality of clocked gates consists of the second NFET, the second PFET, and the fifth PFET.

16. A method of a latch using a low power latch topology, the method comprising:

receiving, at a functional clock input node, a functional clock signal that periodically transitions between an active phase and an inactive phase;

receiving, at a data input node, an input signal indicative of a binary data value;

latching, by a latch circuit, the binary data value based on the functional clock signal being in the active phase; and outputting the binary data value until a different data value is received at the data input node;

wherein the latch circuit includes a plurality of gates including a plurality of clocked gates and a plurality of non-clocked gates, the plurality of clocked gates including a maximum of three clocked gates; and wherein each of the plurality of non-clocked gates persists in a static state across clock transitions while the latch device stores a logic zero and the binary data value at the data input node is logic zero.

17. The method of claim 16, wherein the latch circuit is configured to output a change in the binary data value when the binary data value at the data input node changes during the active phase of the functional clock signal.

18. The method of claim 16, wherein the latch circuit is free of transmission gates.

19. The method of claim 16, wherein each of the plurality of clocked gates receives the functional clock signal.

20. The method of claim 16 further comprising receiving, during a scan operation, scan data via a scan port of the latch.

* * * * *